US009464788B2

(12) United States Patent
Boomgaarden et al.

(10) Patent No.: US 9,464,788 B2
(45) Date of Patent: Oct. 11, 2016

(54) METHOD OF ASSEMBLING A LIGHTING DEVICE WITH FLEXIBLE CIRCUITS HAVING LIGHT-EMITTING DIODES POSITIONED THEREON

(71) Applicant: LIGHTING SCIENCE GROUP CORPORATION, Satellite Beach, FL (US)

(72) Inventors: Mark Penley Boomgaarden, Satellite Beach, FL (US); Ricardo Romeu, Melbourne, FL (US); Eric Holland, Indian Harbour Beach, FL (US)

(73) Assignee: Lighting Science Group Corporation, Cocoa Beach, FL (US)

(*) Notice: Subject to any disclaimer, the term of this patent is extended or adjusted under 35 U.S.C. 154(b) by 193 days.

(21) Appl. No.: 13/969,090

(22) Filed: Aug. 16, 2013

(65) Prior Publication Data

US 2015/0047186 A1 Feb. 19, 2015

(51) Int. Cl.

| | |
|---|---|
| ***H05K 3/30*** | (2006.01) |
| ***F21V 14/02*** | (2006.01) |
| ***F21K 99/00*** | (2016.01) |

(Continued)

(52) U.S. Cl.

CPC ............ *F21V 14/02* (2013.01); *F21K 9/1355* (2013.01); *F21V 23/006* (2013.01); *F21V 29/506* (2015.01); *F21V 3/00* (2013.01); *F21V 29/70* (2015.01); *F21V 29/78* (2015.01); *F21V 31/03* (2013.01); *F21Y 2111/007* (2013.01); *Y10T 29/4913* (2015.01)

(58) Field of Classification Search

CPC ................. Y10T 29/49126; Y10T 29/49128; H01L 2924/01079

USPC ........................................................ 29/832

See application file for complete search history.

(56) References Cited

U.S. PATENT DOCUMENTS 2,981,827 A * 4/1961 Orsatti ............................ 362/84
4,136,378 A * 1/1979 Chevali ........................... 362/13

(Continued)

FOREIGN PATENT DOCUMENTS

| | | |
|---|---|---|
| DE | 10105622 | 8/2002 |
| EP | 0441965 | 8/1991 |

(Continued)

OTHER PUBLICATIONS

U.S. Appl. No. 13/968,994, Aug. 2013, Boomgaarden et al.

(Continued)

*Primary Examiner* — Paul D Kim

(74) *Attorney, Agent, or Firm* — Mark Malek; Stephen Bullock; Widerman Malek, PL

(57) ABSTRACT

A method of assembling a lighting device that has a base, an optic defining an optical chamber, a driver circuit positioned in electrical communication with the base, and a flexible circuit board positioned within the optical chamber along and generally circumscribing a longitudinal axis of the optical chamber and in electrical communication with the driver circuit. The flexible circuit board may comprise a plurality of longitudinal sections. Each longitudinal section may comprise a first inclined section, a second inclined section, and a plurality of light-emitting diodes (LEDs). The first inclined section may be positioned in the direction of the base relative to the second inclined section. The lighting device may further include a longitudinal translation device to translate longitudinally part of the flexible circuit board.

12 Claims, 12 Drawing Sheets

(51) Int. Cl.

| | |
|---|---|
| ***F21V 23/00*** | (2015.01) |
| ***F21V 29/506*** | (2015.01) |
| *F21V 31/03* | (2006.01) |
| *F21V 3/00* | (2015.01) |
| *F21Y 111/00* | (2016.01) |
| *F21V 29/70* | (2015.01) |
| *F21V 29/78* | (2015.01) |

(56) References Cited

U.S. PATENT DOCUMENTS

| | | | | |
|---|---|---|---|---|
| 4,243,934 | A * | 1/1981 | Brasfield | 324/72 |
| 4,423,473 | A * | 12/1983 | Kirkley | 362/186 |
| 4,455,562 | A * | 6/1984 | Dolan et al. | 347/130 |
| 5,136,483 | A * | 8/1992 | Schoniger et al. | 362/545 |
| 5,162,696 | A * | 11/1992 | Goodrich | 313/511 |
| 5,175,528 | A * | 12/1992 | Choi et al. | 340/331 |
| 5,313,187 | A * | 5/1994 | Choi et al. | 340/331 |
| 5,358,880 | A * | 10/1994 | Lebby et al. | 438/26 |
| 5,463,536 | A | 10/1995 | Chou et al. | |
| 5,585,783 | A * | 12/1996 | Hall | 340/473 |
| 5,707,132 | A * | 1/1998 | Ooki et al. | 362/522 |
| 5,749,646 | A * | 5/1998 | Brittell | 362/231 |
| D395,092 | S | 6/1998 | Vakil | |
| 5,782,553 | A * | 7/1998 | McDermott | 362/245 |
| 5,877,863 | A * | 3/1999 | Ross et al. | 356/445 |
| 5,929,788 | A * | 7/1999 | Vukosic | 340/908.1 |
| 6,016,038 | A * | 1/2000 | Mueller et al. | 315/291 |
| D427,335 | S | 6/2000 | Noll | |
| 6,150,771 | A * | 11/2000 | Perry | 315/291 |
| 6,150,774 | A | 11/2000 | Mueller | |
| 6,166,496 | A | 12/2000 | Lys | |
| 6,211,626 | B1 * | 4/2001 | Lys et al. | 315/291 |
| 6,220,722 | B1 * | 4/2001 | Begemann | 362/231 |
| 6,227,679 | B1 * | 5/2001 | Zhang et al. | 362/236 |
| 6,285,119 | B1 * | 9/2001 | Sundhar | 313/318.04 |
| 6,286,969 | B1 * | 9/2001 | Kurokawa et al. | 362/11 |
| 6,293,684 | B1 * | 9/2001 | Riblett | 362/184 |
| 6,345,903 | B1 * | 2/2002 | Koike et al. | 362/241 |
| 6,369,781 | B2 * | 4/2002 | Hashimoto et al. | 345/60 |
| 6,371,636 | B1 * | 4/2002 | Wesson | 362/545 |
| 6,489,937 | B1 * | 12/2002 | Ruvinsky | 345/46 |
| D470,606 | S | 2/2003 | Bobel | |
| D470,608 | S | 2/2003 | Bobel | |
| D470,610 | S | 2/2003 | Bobel | |
| 6,523,978 | B1 * | 2/2003 | Huang | 362/249.04 |
| 6,548,967 | B1 * | 4/2003 | Dowling et al. | 315/318 |
| 6,580,228 | B1 * | 6/2003 | Chen et al. | 315/185 R |
| 6,597,759 | B2 * | 7/2003 | Mazess et al. | 378/53 |
| 6,600,274 | B1 * | 7/2003 | Hughes | 315/291 |
| 6,608,453 | B2 * | 8/2003 | Morgan et al. | 315/312 |
| 6,621,222 | B1 * | 9/2003 | Hong | 315/51 |
| D482,143 | S | 11/2003 | Buschmann et al. | |
| 6,659,632 | B2 | 12/2003 | Chen | |
| 6,662,489 | B2 * | 12/2003 | Spiro et al. | 43/107 |
| 6,674,096 | B2 * | 1/2004 | Sommers | 257/98 |
| 6,683,419 | B2 * | 1/2004 | Kriparos | 315/224 |
| 6,697,130 | B2 * | 2/2004 | Weindorf et al. | 349/65 |
| D487,940 | S | 3/2004 | Buschmann et al. | |
| 6,707,247 | B2 * | 3/2004 | Murano | 313/501 |
| 6,709,126 | B1 * | 3/2004 | Leen | 362/95 |
| 6,709,132 | B2 | 3/2004 | Ishibashi | |
| 6,724,156 | B2 * | 4/2004 | Fregoso | 315/291 |
| D490,919 | S | 6/2004 | Wiesmeth | |
| D491,301 | S | 6/2004 | Chen | |
| D493,007 | S | 7/2004 | Rugendyke et al. | |
| D498,310 | S | 11/2004 | Gagnon et al. | |
| 6,822,397 | B2 * | 11/2004 | Kawasaki et al. | 315/169.2 |
| D500,872 | S | 1/2005 | Foo | |
| D501,055 | S | 1/2005 | Packard | |
| 6,840,003 | B2 * | 1/2005 | Moore | 43/113 |
| 6,900,781 | B1 * | 5/2005 | Mori et al. | 345/60 |
| 6,908,214 | B2 | 6/2005 | Luk | |
| D508,575 | S | 8/2005 | Buschmann et al. | |
| D525,374 | S | 7/2006 | Maxik et al. | |
| D525,379 | S | 7/2006 | Maxik et al. | |
| D527,119 | S | 8/2006 | Maxik et al. | |
| 7,086,756 | B2 * | 8/2006 | Maxik | 362/249.04 |
| D528,673 | S | 9/2006 | Maxik et al. | |
| D531,740 | S | 11/2006 | Maxik et al. | |
| D532,532 | S | 11/2006 | Maxik et al. | |
| 7,215,086 | B2 * | 5/2007 | Maxik | 315/247 |
| 7,319,293 | B2 * | 1/2008 | Maxik | 313/636 |
| 7,367,692 | B2 * | 5/2008 | Maxik | 362/307 |
| 7,824,065 | B2 * | 11/2010 | Maxik | 362/234 |
| 8,314,566 | B2 * | 11/2012 | Steele | F21K 9/135<br>315/185 R |
| 2003/0031015 | A1 * | 2/2003 | Ishibashi | 362/249 |
| 2003/0090910 | A1 * | 5/2003 | Chen | 362/555 |
| 2004/0037080 | A1 * | 2/2004 | Luk et al. | 362/252 |
| 2005/0174769 | A1 * | 8/2005 | Yong et al. | 362/235 |
| 2009/0161354 | A1 | 6/2009 | Hsu et al. | |
| 2009/0302730 | A1 | 12/2009 | Carroll et al. | |
| 2010/0271836 | A1 | 10/2010 | Bakk | |
| 2011/0163683 | A1 | 7/2011 | Steele et al. | |
| 2012/0313518 | A1 | 12/2012 | Sun et al. | |
| 2012/0320563 | A1 | 12/2012 | Betsuda | |

FOREIGN PATENT DOCUMENTS

| | | |
|---|---|---|
| EP | 0939429 | 9/1999 |
| FR | 2586844 | 3/1987 |
| JP | 10305453 | 11/1998 |
| JP | 2001243807 | 9/2001 |
| JP | 2001325809 | 11/2001 |
| WO | WO03034458 | 4/2003 |
| WO | WO2004003869 | 1/2004 |
| WO | WO2005090852 A3 | 9/2005 |

OTHER PUBLICATIONS

United States Patent and Tradmeark Office's Non-Final Office Action cited in related U.S. Appl. No. 13/968,994 dated Jul. 1, 2015 (27 pages).

* cited by examiner

METHOD OF ASSEMBLING A LIGHTING DEVICE WITH FLEXIBLE CIRCUITS HAVING LIGHT-EMITTING DIODES POSITIONED THEREON

RELATED APPLICATIONS

This application is filed contemporaneously with and related to U.S. patent application Ser. No. 13/968,994, now pending, titled Lighting Device with Flexible Circuits Having Light-Emitting Diodes Positioned Thereupon and Associated Methods, the content of which is incorporated herein in its entirety by reference.

FIELD OF THE INVENTION

The present invention relates to systems and methods for lighting devices including flexible circuits.

BACKGROUND OF THE INVENTION

The lighting industry is gradually moving towards the use of light-emitting semiconductors, such as light-emitting diodes (LEDs) due to their advantages of lower energy consumption than traditional incandescent bulbs and their lack of hazardous materials, such as mercury, which is present in compact fluorescent light bulbs (CFLs). However, in general, LEDs are positioned on a printed circuit board (PCB) that is opaque, causing light emitted from the LED to be emitted in a hemisphere generally opposite the PCB. As such, lighting devices employing PCB-based LEDs have needed to take extraordinary measures to accommodate the rigidity of traditional PCBs while still achieving desirable light distribution, namely, approximately uniform light in a 4Π steradian distribution.

Flexible circuit boards ("flex circuits") present an alternative to traditionally rigid PCBs. Flex circuits may have a curvature along one or more axes. Additionally, flex circuits may be folded for a more abrupt change of direction beyond a minimum radius of curvature, below which the circuit folds.

Additionally, the cost of LED-based lighting devices has tended to be higher than lighting devices including other methods of emitting light due to the relatively high price of LEDs. Accordingly, fewer numbers of LEDs were economically feasible to include in a lighting device. As such, the amount of light emitted by each individual LED of a lighting device needed to be maximized, so as to produce enough light sufficient for consumer use. As the efficiency of LEDs, namely, the amount of light emitted, decreases with an increase of temperature beyond a certain threshold, an LED-based lighting device frequently employed a heat sink to increase the thermal dissipation capacity of the lighting device. A heat sink adds cost to a lighting device, as well as tending to add significant weight, as typical heat sinks are fabricated of aluminum and alloys thereof. However, as the cost of LEDs has come down, the need to operate each individual LED at a peak efficiency associated with a certain peak operating temperature is no longer necessary to maintain commercial viability, and indeed, it is becoming more economically disadvantageous to include a heat sink. However, it is still desirous to operate LEDs as close to their peak operating temperatures as is feasible. Accordingly, there is a need in the art that This background information is provided to reveal information believed by the applicant to be of possible relevance to the present invention. No admission is necessarily intended, nor should be construed, that any of the preceding information constitutes prior art against the present invention.

SUMMARY OF THE INVENTION

With the foregoing in mind, embodiments of the present invention are related to a method of assembling a lighting device having a base adapted to be coupled with a light fixture socket, an optic having a curved inner surface defining an optical chamber, a driver circuit that may be positioned in electrical communication with the base, and a flexible circuit board that may be positioned within the optical chamber along and generally circumscribing a longitudinal axis of the optical chamber and in electrical communication with the driver circuit. The flexible circuit board may comprise a plurality of longitudinal sections. Each longitudinal section may comprise a first inclined section, a second inclined section, and a plurality of light-emitting diodes (LEDs). The first inclined section may be positioned in the direction of the base relative to the second inclined section.

The method of assembling the above lighting device may include the steps of positioning the flexible circuit board in a collapsed position, disposing the flexible circuit board within the optical chamber by passing the flexible circuit board through an aperture of the optic, transitioning the flexible circuit board into an expanded position, positioning the flexible circuit board in electrical communication with the driver circuit, attaching the base to the optic, and positioning the driver circuit in electrical communication with the base. The expanded position of the flexible circuit board may have a diameter that is greater than a diameter of the aperture of the optic.

In some embodiments, the lighting device may include a structural member. In such embodiments, the method may further include the steps of positioning the structural member within the optical chamber, attaching the flexible circuit board to the structural member, and transitioning the flexible circuit board into the expanded position generally about the structural member.

The lighting device may further include a longitudinal translation device. In such embodiments, the method may further include operating the longitudinal translation device to transition the flexible circuit board into the expanded position. In some embodiments, where the longitudinal translation device has a spiraled configuration, that step my include turning the longitudinal translation device.

Additionally, in some embodiments, the flexible circuit board may include a plurality of longitudinal sections having first and second inclined sections having LEDs associated therewith. In such embodiments, the method may further include folding the flexible circuit board so as to form the longitudinal sections. Additionally, in such embodiments, the method may further include the step of folding the flexible circuit board so as to form a generally prismatic structure. Furthermore, the method may further include folding the longitudinal sections so as to form the first and second inclined sections.

DETAILED DESCRIPTION OF THE PREFERRED EMBODIMENT

Figure 1:
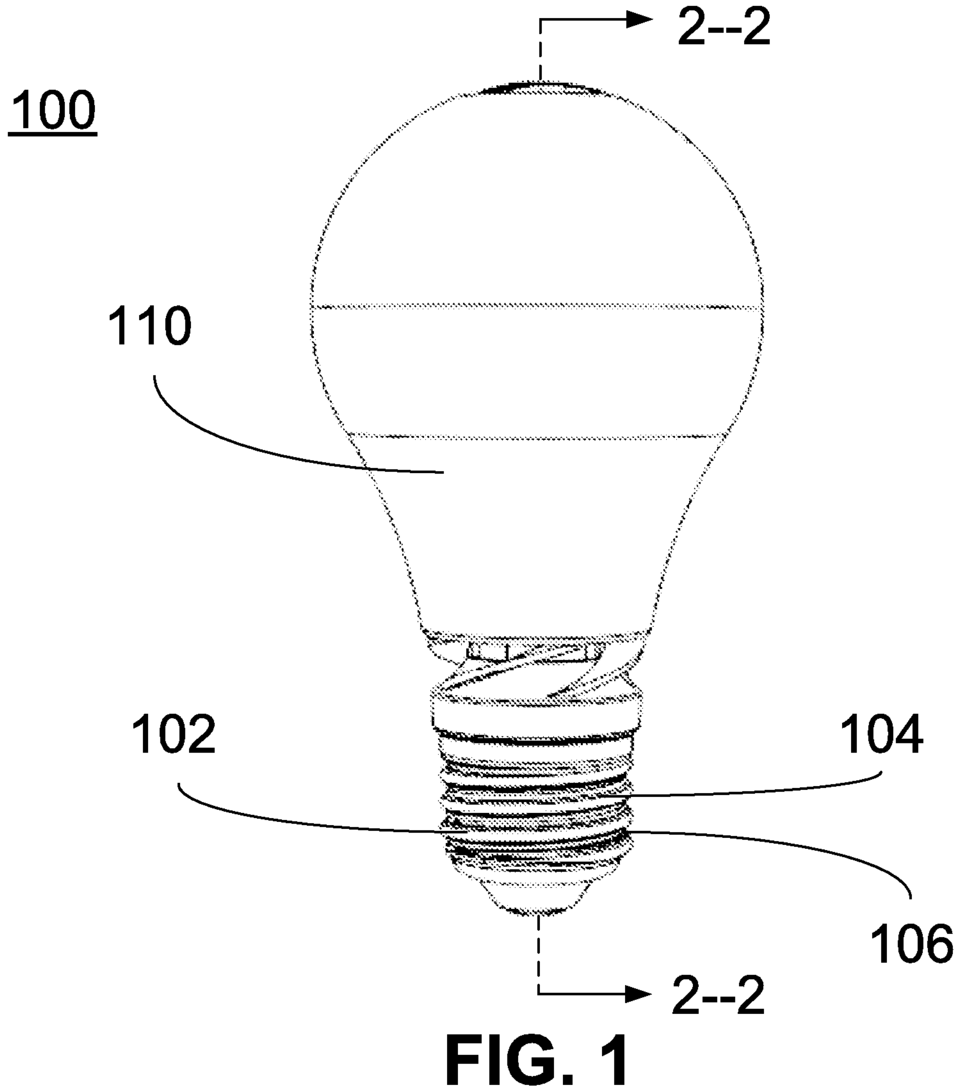
FIG. 1 is a side elevation view of a lighting device according to an embodiment of the invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

In this detailed description of the present invention, a person skilled in the art should note that directional terms, such as "above," "below," "upper," "lower," and other like terms are used for the convenience of the reader in reference to the drawings. Also, a person skilled in the art should notice this description may contain other terminology to convey position, orientation, and direction without departing from the principles of the present invention.

Furthermore, in this detailed description, a person skilled in the art should note that quantitative qualifying terms such as "generally," "substantially," "mostly," and other terms are used, in general, to mean that the referred to object, characteristic, or quality constitutes a majority of the subject of the reference. The meaning of any of these terms is dependent upon the context within which it is used, and the meaning may be expressly modified.

Throughout this disclosure, the present invention may be referred to as relating to luminaires, digital lighting, light sources, and light-emitting diodes (LEDs). Those skilled in the art will appreciate that this terminology is only illustrative and does not affect the scope of the invention. For instance, the present invention may just as easily relate to lasers or other digital lighting technologies. Additionally, a person of skill in the art will appreciate that the use of LEDs within this disclosure is not intended to be limited to any specific form of LED, and should be read to apply to light emitting semiconductors in general. Accordingly, skilled artisans should not view the following disclosure as limited to any particular light emitting semiconductor device, and should read the following disclosure broadly with respect to the same.

An embodiment of the invention, as shown and described by the various figures and accompanying text, provides a lighting device including a flexible circuit. The lighting device may employ the flexible circuit so as to achieve a light distribution about the lighting device. Furthermore, the lighting device may be configured to permit the repositioning of the flexible circuit board so as to manipulate the distribution of light about the lighting device.

Referring now to FIG. 1, a lighting device 100 according to an embodiment of the present invention is presented. The lighting device 100 may include a base 102 and an optic 110. The base 102 may be configured to couple with a socket of a lighting fixture. Accordingly, the base 102 may be configured to couple with any type of socket known in the art. In the present embodiment, the base 102 may be configured to couple with an Edison screw socket. This embodiment is exemplary only, and all other socket configurations are contemplated and included within the scope of the invention, including, but not limited to, bayonet, double contact bayonet, bi-pin, bi-post, wedge, and GU10 turn and lock sockets. The coupling of the base 102 to a lighting fixture socket may position the base 102 in electrical communication with the socket, which in turn may be in electrical communication with a power source. Accordingly, the base 102 may be positioned in electrical communication with a power source via its coupling with the lighting fixture socket. The base 102 may be configured to be positioned in electrical communication with any number of electrical terminals of the lighting fixture socket, as may be determined by the type of socket employed by the lighting fixture.

The base 102 may comprise a plurality of threads 104. The plurality of threads 104 may be configured to interface with threads of an Edison socket, thereby facilitating the coupling of the base 102 thereto. Additionally, the plurality of threads 104 may be configured to permit the attachment of additional elements of the lighting device 100 thereto. More specifically, the plurality of threads 104 may comprise external threads 106 configured to facilitate attachment to an Edison socket, and internal threads (not shown) configured to facilitate attachment of additional elements of the lighting device 100. More details regarding this feature will be disclosed hereinbelow.

Figure 2:
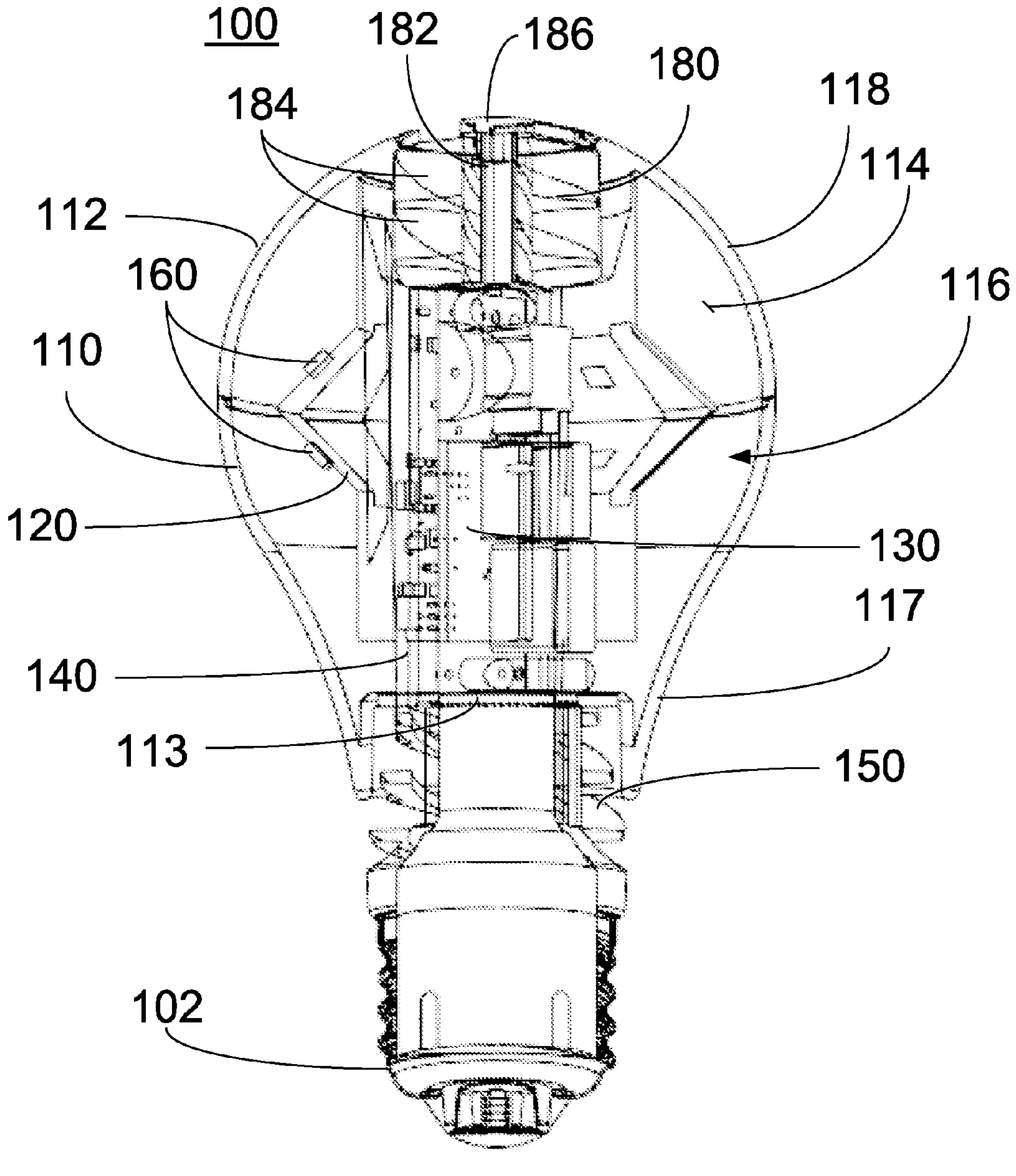
FIG. 2 is a cross-sectional view of the lighting device of FIG. 1 taken through line 2-2.

Referring now to FIG. 2, the lighting device 100 will be discussed in greater detail. As seen in FIG. 1, the lighting device 100 may include a base 102 and an optic 110. The lighting device 100 may further include a flexible circuit board 120, a driver circuit 130, a structural member 140, and a longitudinal translation device 150.

Continuing to refer to FIG. 2, the optic 110 will now be discussed in greater detail. The optic 110 may be configured to have an outer surface 112 and an inner surface 114. The optic 110 may be configured to have a shape such that the inner surface 114 defines an optical chamber 116. In some embodiments, the inner surface 114 may be generally curved. The optic 110 may be configured such that the optical chamber 116 has a volume, and such that the volume is sufficient to permit the positioning of various elements, structures, and members of the lighting device 100 therewithin.

Additionally, the optic 110 may be configured to have any shape, geometry, or configuration. In some embodiments, the optic 110 may be configured to conform to a standardized shape for a lighting device, such as a light bulb. Types of standard bulb shapes contemplated by the invention include, but are not limited to, A series bulbs, B series bulbs, C series bulbs, CA series bulbs, S series bulbs, F series bulbs, RP, MB, and BT series bulbs, R series bulbs, MR series bulbs, PS series bulbs, AR series bulbs, ALR series bulbs, BR series bulbs, PAR series bulbs, T series bulbs, G series bulbs, BT series bulbs, E series bulbs, and ED series bulbs. This list of bulb shapes is exemplary only and does not limit the scope of bulb shapes contemplated by the invention.

The optic 110 may be formed of any transparent or translucent material. Furthermore, the optic 110 may be formed so as to redirect, refract, adjust, or otherwise impact light that is incident upon the inner surface 114 and that is emitted from the outer surface 112.

In some embodiments, the optic 110 may be configured to include two or more attachable sections. For example, in the present embodiment, the optic 110 includes a proximal section 117 and a distal section 118. The proximal and distal sections 117, 118 may be configured to be attached to one another by any means or method known in the art, including, but not limited to, adhesives, glues, welding, press fit, interference fit, screw fit, fasteners, and the like.

Figure 3:
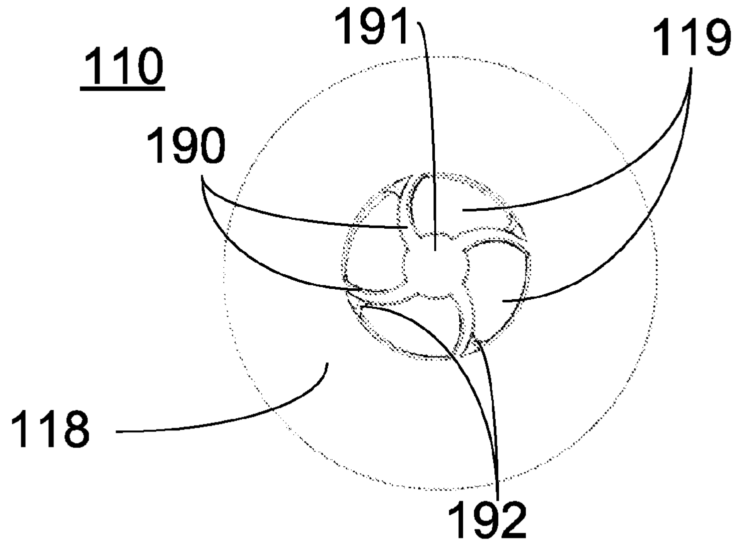
FIG. 3 is a top plan view of the lighting device of FIG. 1.

Referring now to FIG. 3, an additional aspect of the optic 110 will now be discussed. The optic 110 may include one or more distal voids 119. The distal voids 119 may be formed in any part of the optic 110. In the present embodiment, the distal voids 119 are formed in the distal section 118 of the optic 110. More specifically, the distal voids 119 are formed at an apex of the distal section 118 that corresponds to an apex of the lighting device 100. The distal voids 119 may be configured so as to facilitate the flow of fluid therethrough. In some embodiments, the flow of fluid through the distal voids 119 may increase the thermal dissipation capacity of the lighting device 100. Furthermore, the distal voids 119 may be configured to increase the thermal dissipation capacity of the lighting device 100 without compromising the structural integrity structure of the lighting device 100 including the distal voids 119, namely, in the present embodiment, the distal section 118.

In the present embodiment, the distal void 119 are defined as interstices between adjacent arms 190 and a hub 191. The arms 190 and the hub 191 may be configured to define the distal voids 119 so as to permit fluid flow therethrough while maintaining structural integrity of the optic 110, namely the distal section 118. The hub 191 may be positioned at the apex of the distal section 191 and the arms 190 may connect the hub 191 to the rest of the distal section 118. In some embodiments, secondary arms 192 may be included to provide additional support to the arms 190.

Figure 4:
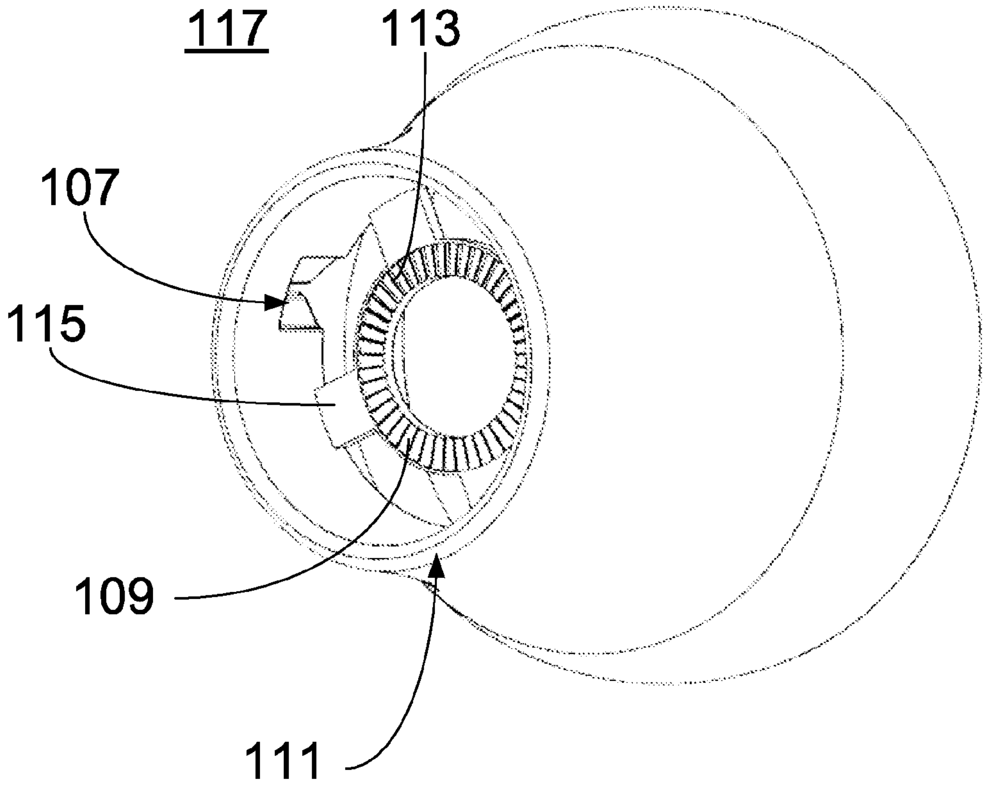
FIG. 4 is a lower perspective view of a proximal section of the optic of the lighting device of FIG. 1.

Referring now to FIG. 4, the proximal section 117 of the optic 110 will now be discussed in greater detail. The proximal section 117 may include a proximal void 111. The proximal void 111 may be formed at a proximal end of the proximal section 117. More specifically, the proximal void 111 may be formed at a nadir of the proximal section 117.

In some embodiments, the proximal section 117 may include a support member 113 and one or more support arms 115. The support arms 115 may extend from the inner surface 114 attach to the support member 113 so as to position the support member 113 in a selected position. More specifically, the support arms 115 may position the support member 113 such that a center axis of the support member 113 is collinear with the longitudinal axis of the optic 110.

In some embodiments, the support member 113 may be generally annular in shape and may define a void therein. Additionally, the support member 113 may have a plurality of ridges 109 formed therein. The plurality of ridges 109 may be configured to cooperate with another structure of the lighting device 100, as will be discussed in greater detail hereinbelow.

In some embodiments, the support member 113 may include one or more receiving sections 107. The receiving sections 107 may be configured to permit the disposal of another structure of the lighting device 100 therewithin, as will be discussed in greater detail hereinbelow.

Furthermore, in some embodiments, the optic 110 may comprise a color conversion layer (not shown). The color conversion layer may be configured to receive a source light having a first wavelength range, and to convert source light to a second wavelength range, defined as a converted light. In some embodiments, the color conversion layer may be positioned on the inner surface 114. The color conversion layer may be attached, deposited, or otherwise positioned on a section of the optic 110 by any means that is suitable to the material forming the color conversion layer. In some embodiments, the optic 110 may include two or more color conversion layers positioned upon different sections of the optic 110. Each of the two or more color conversion layers may convert respective source lights of the same or differing wavelengths to respective converted lights of differing wavelengths. The optic 110 may include any number of color conversion layers, including overlapping layers. Color conversion layers may be constructed of material selected from the group consisting of phosphors, quantum dots, luminescent materials, fluorescent materials, and dyes. More details regarding the enablement and use of a color conversion layer may be found in U.S. patent application Ser. No. 13/073,805, entitled MEMS Wavelength Converting Lighting Device and Associated Methods, filed Mar. 28, 2011, as well as U.S. patent application Ser. No. 13/234,604, entitled Remote Light Wavelength Conversion Device and Associated Methods, filed Sep. 16, 2011, U.S. patent application Ser. No. 13/234,371, entitled Color Conversion Occlusion and Associated Methods, filed Sep. 16, 2011, and U.S. patent application Ser. No. 13/357,283, entitled Dual Characteristic Color Conversion Enclosure and Associated Methods, the entire contents of each of which are incorporated herein by reference.

In addition to transparency or translucency, in some embodiments, the optic 110 may be formed of a material that has certain thermal properties. For example, the optic 110 may be formed of a material that may generally increase the thermal dissipation capacity of the lighting device 100. Additionally, the optic 110 may be positioned in thermal communication with one or more heat-generating elements of the lighting device 100, as will be discussed in greater detail hereinbelow.

Continuing to refer to FIG. 2, a venting member 180 of the lighting device 100 will now be discussed in greater detail. The venting member 180 may be configured to position the optical chamber 116 in fluid communication with the environment surrounding the lighting device 100. Furthermore, in some embodiments, the venting member 180 may be configured to inhibit the entry of foreign material into the optical chamber 116. In the present embodiment, the venting member 180 has a generally spiral configuration, comprising a center member 182 and one or more ramp members 184. The ramp members 184 may extend generally radially outward from the center member 182 and traverse the length of the center member 182 at an angle, such that there is no line-of-sight between the environment surrounding the lighting device 100 and the optical chamber 116 therethrough. Fluid may be permitted to flow through the voids formed between adjacent ramp members 184.

The venting member 180 may include an attachment section 186. In the present embodiment, the attachment section 186 is a generally distal section of the center member 184. The attachment section 186 may be configured to enable the attachment of the venting member 180 to an element of the lighting device 100 permitting the venting member 180 to be carried thereby. In the present embodiment, the attachment section 186 may be configured to attach to the optic 110. More specifically, the attachment section 186 may be configured to attach to the distal section 118 of the optic 110. Yet more specifically, the attachment section 186 may be configured to attach to an apex of the distal section 118 of the optic 110. Moreover, the attachment section 186 may be configured to position the venting member 180 such that fluid flow permitted between the voids formed between the ramp members 184 is in fluid communication with the voids 119 of the distal section 118 of the optic 110.

Continuing to refer to FIG. 2, a flexible circuit board 120 of the lighting device 100 will now be discussed in greater detail. The lighting device 100 may include a flexible circuit board 120 positioned at least partially within the optical chamber 116. Additionally, the flexible circuit board 120 may be positioned in electrical communication with at least one of the base 102 and the driver circuit 130. Additionally, the flexible circuit board 120 may further include a plurality of light sources 160 positioned thereupon. The flexible circuit board 120 may include circuitry configured to position each of the plurality of light sources 160 in electrical communication with at least one of the base 102 and the driver circuit 130. Furthermore, the flexible circuit board 120 may include circuitry that allows the plurality of light sources 160 to operate collectively as a group, individually, or in various combinations.

Moreover, in some embodiments, the plurality of light sources 160 may comprise first and second pluralities of light sources. A first plurality of light sources may be configured to emit light within a first wavelength range corresponding to a first color, and the second plurality of light sources may be configured to emit light within a second wavelength range corresponding to a second color. Each of the first and second colors may be selected so as to combine, either within the optical chamber 116 or without, to form a combined light in the form of a metamer. Moreover, each of the first and second colors may be selected so as to form a metamer having selected characteristics, such as color, color temperature, and any other characteristic of light. More information regarding the combination of wavelengths of light to form metamers, and the processes of selecting and selectively emitting said wavelengths, may be found in U.S. patent application Ser. No. 13/737,606 titled Tunable Light System and Associated Methods filed Jan. 9, 2013, U.S. patent application Ser. No. 13/775,936 titled Adaptive Light System and Associated Methods filed Feb. 25, 2013, and U.S. patent application Ser. No. 13/803,825 titled System for Generating Non-Homogenous Biologically-Adjusted Light and Associated Methods filed Mar. 14, 2013, the contents of each of which are incorporated in their entirety herein by reference.

In some embodiments, the plurality of light sources 160 may comprise a plurality of LEDs. Each LED of the plurality of LEDs may be configured to emit light within a wavelength range. In some embodiments, one of an LED of the plurality of LEDs or the optic, as described hereinabove, may include a color conversion layer. The color conversion layer may be configured to receive light emitted from an LED of the plurality of LEDs within a first wavelength range, and emit a converted light within a converted wavelength range. Furthermore, the conversion layer may be configured to emit the converted light in the direction of the optic 110 such that the converted light passes through the optic 110. In some embodiments, the LED of the plurality of LEDs may be a blue LED, the color conversion layer may be configured to perform a Stokes shift on light incident thereupon to emit a white converted light. Moreover, the conversion layer may be positioned in thermal communication with either of the optic 110 and the LED of the plurality of LEDs, whichever it is included with.

The lighting device 100 may have a thermal dissipation capacity. The thermal dissipation capacity may be understood as an amount of heat that may be dissipated by the lighting device 100 in a given amount of time. The thermal dissipation capacity of the lighting device 100 may be managed through the inclusion, exclusion, or adjustment of various features and elements of the lighting device 100 described herein. Moreover, the plurality of light sources 160 may have an operational efficiency associated with the temperature of each light source 160 of the plurality of light sources 160. Additionally, the greater the number of light sources 160 included in the lighting device 100, the greater the amount of heat generated by the operation of the lighting device 100. In order to maintain a selected level of operational efficiency, the lighting device 100 must have a thermal dissipation capacity sufficient to dissipate the heat generated by the various heat-generating elements of the lighting device 100, including the driver circuit 130 and the plurality of light sources 160. Therefore, the number of light sources 160 included in the plurality of light sources 160 may be determined based on the thermal dissipation capacity of the lighting device 100, determining an operational thermal equilibrium. Moreover, the number of light sources 160 included in the plurality of light sources 160 may be such that each light source 160 operates at a minimum level of operational efficiency. Additionally, in some embodiments, the thermal dissipation capacity of the lighting device 100 may be increased by the inclusion of a fluid flow generator, as discussed hereinbelow, thereby increasing the number of lighting devices that may operate within the selected level of operational efficiency, as it is affected by operating temperature, so as to maintain the operational thermal equilibrium.

Figure 5:
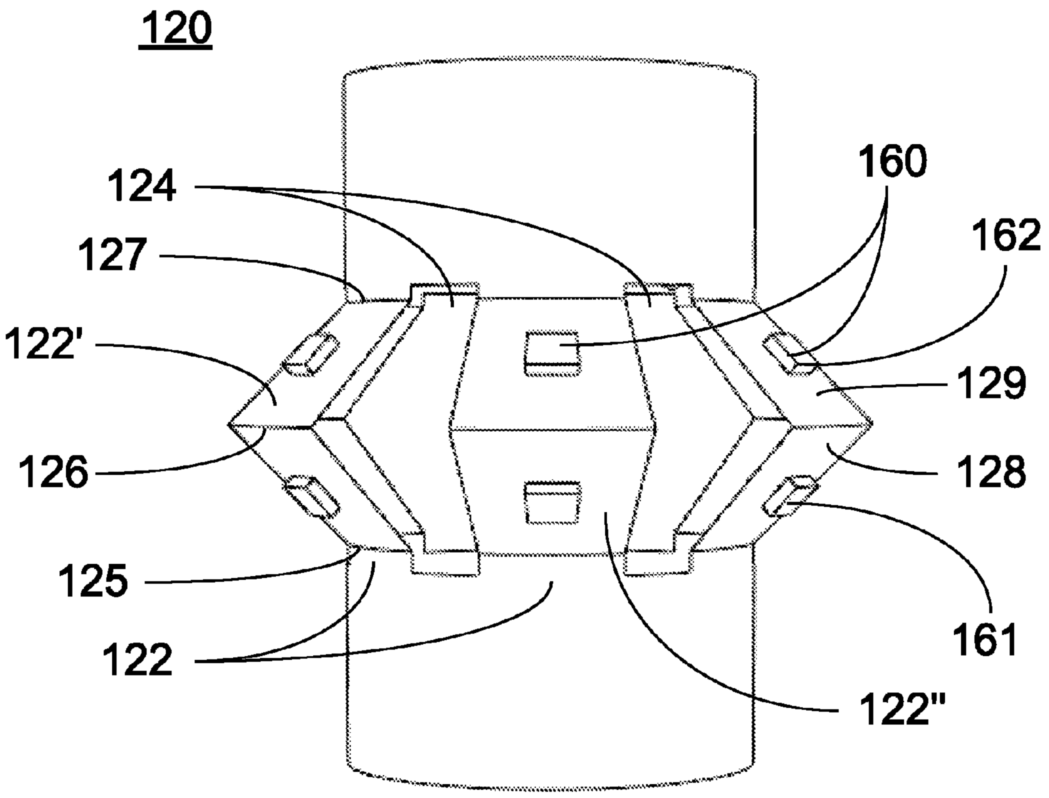
FIG. 5 is a side elevation view of a flexible circuit board in an expanded position of the lighting device of FIG. 1.

Referring now to FIG. 5, the flexible circuit board 120 will now be discussed in greater detail. The flexible circuit board 120 may be configured to be bent, folded, or otherwise manipulated into a desirous geometry. In some embodiments, the flexible circuit board 120 may be configured to be manipulated so as to form two ends, where each end forms a closed geometric figure. In the present embodiment, the flexible circuit board 120 may be configured to form a circle at each end. Other geometries are contemplated and included within the scope of the embodiment, including, but not limited to, ovals, ellipses, triangles, rectangles, squares, pentagons, hexagons, heptagons, octagons, and all other polygons. Accordingly, the flexible circuit board 120 may be manipulated so as to have a generally cylindrical configuration.

In some embodiments, the flexible circuit board 120 may comprise a plurality of longitudinal sections 122. The plurality of longitudinal segments 122 may be sections of the flexible circuit board 120 that have a structural feature that are parallel to a longitudinal axis of the flexible circuit board 120, which may be defined when the flexible circuit board 120 is manipulated to define two closed geometric figures at either end as described hereinabove. The plurality of longitudinal sections 122 may be configured so as to facilitate the manipulation of the flexible circuit board 120 into a particular geometry as described hereinabove. For example, the flexible circuit board 120 may comprise a plurality of interstices 124 formed between adjacent longitudinal sections 122. The plurality of interstices 124 may facilitate the physical translation or deformation of the plurality of longitudinal sections 122 so as to facilitate the manipulation of the flexible circuit board 120. Moreover, the plurality of interstices 124 may facilitate the bending of the longitudinal sections 122 as described in greater detail hereinbelow. The dimensions of the plurality of interstices 124 may be uniform or may vary by each interstice. Moreover, the dimensions of the plurality of interstices 124 may be configured to result in particular physical properties of the adjoining longitudinal sections 122.

In some embodiments, the plurality of longitudinal sections 122 may be configured to have approximately equal dimensions, such as, for example, an approximately equal width. In some other embodiments, one or more of the plurality of longitudinal sections 122 may have one or more dimensions that are different from the corresponding dimension of another one of the plurality of longitudinal sections 122. Additionally, the plurality of longitudinal sections 122 may be dimensioned such that they are evenly distributed about a periphery of the flexible circuit board 120 or, alternatively, they may be dimensioned such that they are distributed unevenly about the periphery of the flexible circuit board 120.

In some embodiments, the flexible circuit board 120 may be configured to include structural features that facilitate the bending of certain sections thereof. For example, the flexible circuit board 120 may comprise a proximal folding section 125, a medial folding section 126, and a distal folding section 127. Moreover, in some embodiments, each longitudinal section 122 of the plurality of longitudinal sections 122 may comprise proximal, medial, and distal folding sections 125, 126, 127. Each of the proximal, medial, and distal folding sections 125, 126, 127 may include structural features that permit the bending thereof. Moreover, each of the proximal, medial, and distal folding sections 125, 126, 127 may include structural features that facilitate the bending thereof in a predetermined direction. For example, as in the present embodiment, each of the proximal and distal folding sections 125, 127 may be configured to facilitate the bending of the associated longitudinal section 122 in a direction such that is generally radially outward from the longitudinal axis of the flexible circuit board 120. Furthermore, the medial folding section 126 may be configured to facilitate the bending of the associated longitudinal section 122 in a direction that is generally radially inward to the longitudinal axis of the flexible circuit board 120. In this configuration, the part of the longitudinal section 122 containing the medial folding section 126 may be generally further away from the longitudinal axis of the flexible circuit board 120 with respect to the proximal and distal folding sections 125, 127 where each of the proximal and distal folding sections 125, 127 are folded as described hereinabove.

The structural features included in the proximal, medial, and distal folding sections 125, 126, 127 may be any structural feature known in the art that may facilitate the creations of folds as described hereinabove. Types of structural may include, but are not limited to, working the flexible circuit board 120 such that the relevant sections are weakened, pre-folding the relevant section, removing structurally supportive material in the relevant section, and the like. Although the creation of folds may be known in the prior art, the configuration of the flexible circuit board 120 described herein is unique.

When each of the proximal, medial, and distal folding sections 125, 126, 127 are manipulated to produce respective folds, a first inclined section 128 may be formed intermediate the proximal and medial folding sections 125, 126 and a second inclined section 129 may be formed intermediate the medial and distal folding sections 126, 127. The first inclined section 128 may be generally in the direction of the base 102 relative to the second inclined section 129. The first inclined section 128 may be generally in the direction of the base 102 relative to the second inclined section 129. The first and second inclined sections 128, 129 may have a shared edged, defining the medial folding section 126.

Additionally, as described hereinabove, the flexible circuit board 120 may include a plurality of light sources 160. More specifically, in some embodiments, one or more light sources 160 of the plurality of light sources 160 may be positioned upon a longitudinal section 122 of the plurality of longitudinal sections 122. Furthermore, in some embodiments, one or both of the first and second inclined portions 128, 129 of each longitudinal section 122 of the plurality of longitudinal sections 122 may have a light source 160 of the plurality of light sources 160 positioned thereupon. In the present embodiment, each longitudinal section 122 comprises a first light source 161 positioned on the first inclined section 128 and a second light source 162 positioned on the second inclined section 129.

In some embodiments. the plurality of light sources 160 may be arranged or positioned on the flexible circuit board 120 in a way so as to result in a combined light being emitted having a desired distribution. In some embodiments, a first longitudinal section 122' may include light sources 160 configured to emit light having a first color, and a second longitudinal section 122" may include light sources 160 configured to emit light having a second color. Furthermore, in some embodiments, where the plurality of light sources 160 are a plurality of LEDs, the first longitudinal section 122' may include one or more LEDs 160 of the plurality of LEDs 160 configured to emit light within a first wavelength range corresponding to a first color, and the second longitudinal section 122" may include one or more LEDs 160 of the plurality of LEDs 160 configured to emit light within a second wavelength range corresponding to a second color. Light may be emitted from the LEDs associated with each of the first and second longitudinal sections 122', 122" and may combine to form a combined light, as described hereinabove. The combined light may be a metamer, and may be perceived as a white light.

The light sources 160 of the plurality of light sources 160 may be any device capable of emitting light. Types of devices include, but are not limited to, light-emitting semiconductors, lasers, incandescent, halogens, arc-lighting devices, fluorescents, and any other digital light-emitting devices or methods known in the art. In the present embodiment, the light sources 160 may be light-emitting semiconductors, more specifically, light-emitting diodes (LEDs). More specifically, in some embodiments, the light sources 160 may be LED packages comprising two or more LED dies. The light sources 160 may be positioned in electrical communication with the circuitry of the flexible circuit board 120, thereby placing the light sources 160 in electrical communication with at least one of the drive circuit 130 and the base 102.

The first and second light sources 161, 162 may be positioned on the first and second inclined sections 128, 129 such that when the first and second light sources 161, 162 are operated, they emit light that may be emitted by the lighting device 100 through the optic 110. In the present embodiment, the first and second light sources 161, 162 are positioned such that an emitting surface of each is oriented in the direction of the optic 110.

Where the proximal, medial, and distal folding sections 125, 126, 127 are manipulated so as to form folds, each of the first and second inclined sections 128, 129 of each longitudinal section 122 may have an angle of inclination. The angle of inclination may be measured as an angle formed between the theoretical intersection of the plane of each of the first and second inclined sections 128, 129 and the longitudinal axis of the flexible circuit board 120. The angle of inclination of each of the first and second inclined sections 128, 129 may be approximately equal to each other, or they may be different.

Where a light source 160 is positioned on either of the first and second inclined sections 128, 129 as described hereinabove, and where the first and second inclined sections 128, 129 include an angle of inclination, the direction of light emitted by the light source 160 positioned thereupon may be impacted by the relevant angle of inclination. More specifically, the direction of light emitted by the first light source 161 may be impacted by the angle of inclination of the first inclined section 128, and the direction of light emitted by the second light source 162 may be impacted by the angle of inclination of the second inclined section 129.

Continuing to refer to FIG. 5, in the present embodiment, the angle of inclination of the first inclined section 128 is such that light emitted by the first light source 161 is non-perpendicular to the longitudinal axis of the flexible circuit board 120 and generally in the direction of the base 102. Furthermore, in the present embodiment, the angle of inclination of the second inclined section 129 is such that the light emitted by the second light source 162 is non-perpendicular to the longitudinal axis of the flexible circuit board 120 and generally in the direction away from the base 102. It is contemplated and included within the scope of the direction that each of the first and second inclined sections 128, 129 may have an angle of inclination so as to result in light being emitted from the first and second light sources 161, 162 in a selected direction. More specifically, each of the proximal, medial, and distal folding sections 125, 126, 127 may be manipulated so as to cause each of the first and second inclined sections 128, 129 to have an angle of inclination as described hereinabove. Moreover, the angle of inclination of each of the first and second inclined sections 128, 129 may be adjusted so as to result in light to be emitted from the lighting device 100 in a selected distribution.

Referring now back to FIG. 2, the positioning of the flexible circuit board 120 will now be discussed in greater detail. The flexible circuit board 120 may be positioned within the optical chamber 116. More specifically, the flexible circuit board 120 may be positioned within the optical chamber 116 such that light emitted by the plurality of light sources 160 results in light being emitted from the lighting device 100 according to a selected distribution. Additionally, the angle of inclination of the first and second sections 128, 129 of each longitudinal section 122 may be accounted for in the positioning of the flexible circuit board 120 within the optical chamber 116. Furthermore, the position of the flexible circuit board 120 within the optical chamber 116 may be altered based upon the angle of inclination of the first and second sections 128, 129, as will be discussed in greater detail hereinbelow.

Continuing to refer to FIG. 2, the driver circuit 130 will now be discussed in greater detail. As recited hereinabove, the driver circuit 130 may be positioned in electrical communication with the base 102 and/or the flexible circuit board 120. Furthermore, the driver circuit 130 may be positioned in electrical communication with the plurality of light sources 160 via the flexible circuit board 120. The driver circuit 130 may include circuitry that enables the driver circuit 130 to control the operation of the plurality of light sources 160. Furthermore, in some embodiments, the driver circuit 130 may be configured to control the operation of each individual light source 160 of the plurality of light sources 160. Accordingly, the driver circuit 130 may be configured to operate all the light sources 160 concurrently, operate them individually, or operate them in various groups and combinations. For example, in some embodiments, the driver circuit 130 may be configured to operate the first light source 161 of each longitudinal section 122 of the flexible circuit board 120 concurrently, such that the lighting device 100 emits light that is primarily in the direction of the base 102. Furthermore, in some embodiments, the driver circuit 130 may be configured to operate the second light source 162 of each longitudinal section 122 of the flexible circuit board 120, such that the lighting device 100 emits light that is primarily in the direction away from the base 102. Additionally, in some embodiments, the driver circuit 130 may be configured to operate the first and second light sources 161, 162 of individual longitudinal sections 122, either individually or in groups of longitudinal sections 122. All other combinations and groups of light sources 160 that may be operated concurrently are contemplated and included within the scope of the invention.

The driver circuit 130 may include circuitry necessary to condition, rectify, or otherwise alter electricity received from the driver circuit's 130 electrical connection to the base 102 so as to operate the plurality of light sources 160. Additionally, the driver circuit 130 may similarly alter electricity so as to be used by any other electrical device associated with the lighting device 100.

Furthermore, the driver circuit 130 may be configured to receive an input to which the driver circuit 130 may operate the plurality of light sources 160 responsive thereto. In some embodiments, the driver circuit 130 may include a wireless communication device configured to receive a wireless signal from the user as the input. Such a wireless communication device may be adapted to receive a user input in the form of an infrared signal, a visible light communication (VLC) signal, a radio signal, such as Wi-Fi, Bluetooth, Zigbee, cellular data signals, Near Field Communication (NFC) signal, and any other wireless communication standard or method known in the art.

Figure 6:
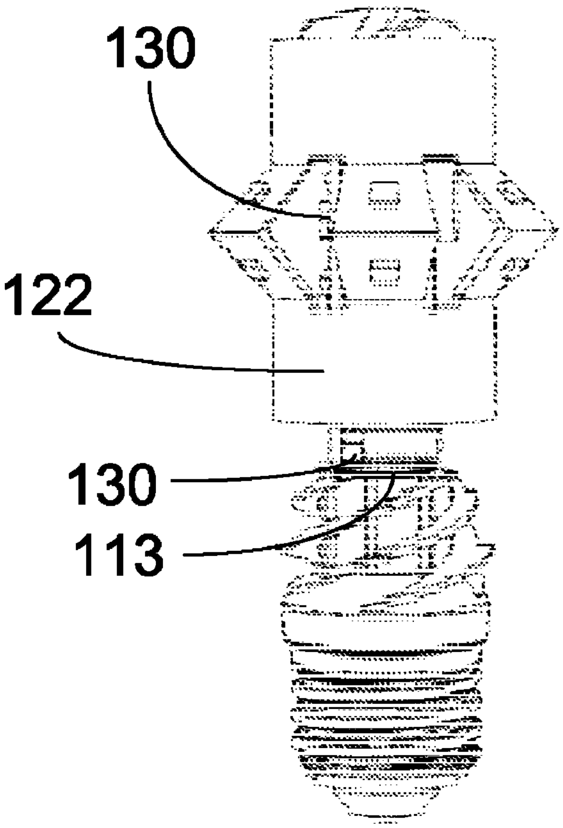
FIG. 6 is a side elevation view of the lighting device of FIG. 1 with an optic of the lighting device removed.

The driver circuit 130 may be positioned within the optical chamber 116 of the optic 110. Referring now to FIG. 6, in some embodiments, the driver circuit 130 may be positioned such that it is at least partially circumscribed by the flexible circuit board 120. Furthermore, the driver circuit 130 may be positioned such that it interfaces with the support member 113 of the distal section 117 of the optic 110, which are illustrated in FIG. 4.

Furthermore, in some embodiments, the driver circuit 130 may be positioned upon the flexible circuit board 120. More specifically, the driver circuit 130 and its constituent electrical components may be included as integral electrical components of the flexible circuit board 120. In such embodiments, the driver circuit 130 may be configured so as to facilitate the manipulation of the flexible circuit board 120 as described hereinabove and in greater detail hereinbelow. Furthermore, the driver circuit 130 may be positioned on a surface of the flexible circuit board 120 generally opposite a surface of the flexible circuit board 120 that the plurality of light sources 160 are positioned upon. Moreover, in some embodiments, the driver circuit 130 may be included on sections of the flexible circuit board 120 other than the first and second inclined sections 128, 129 of each longitudinal section 122.

Figure 7:
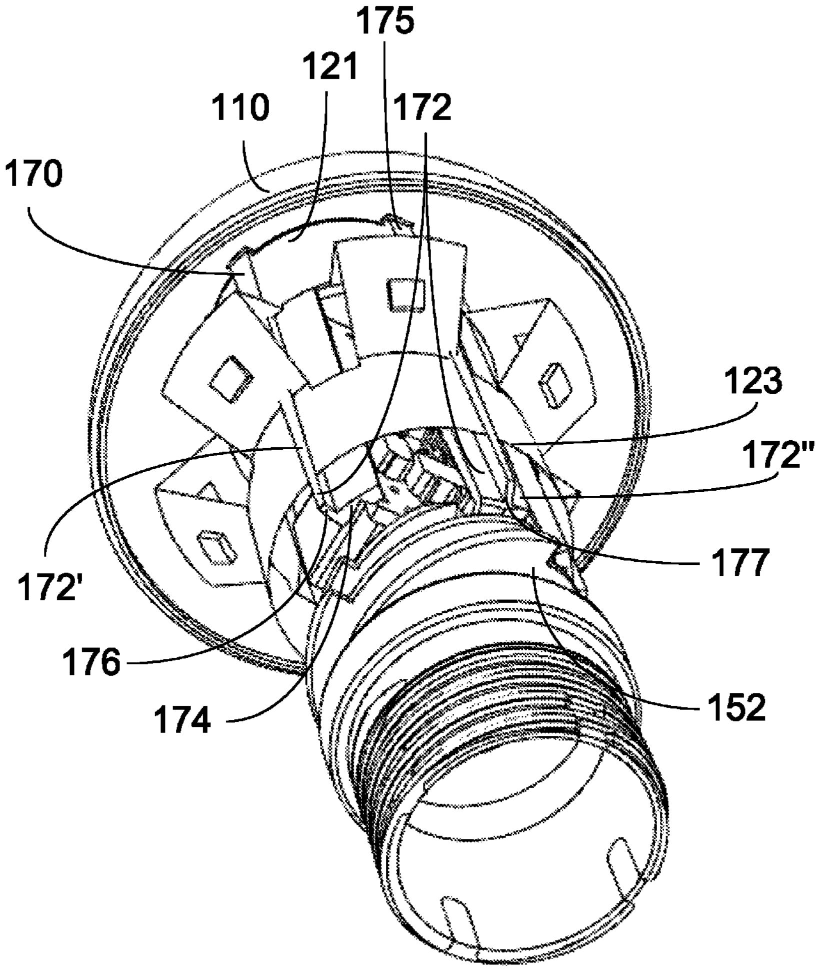
FIG. 7 is a lower perspective view of the lighting device of FIG. 1 with a base of the lighting device and the proximal section of the optic removed.
Figure 8:
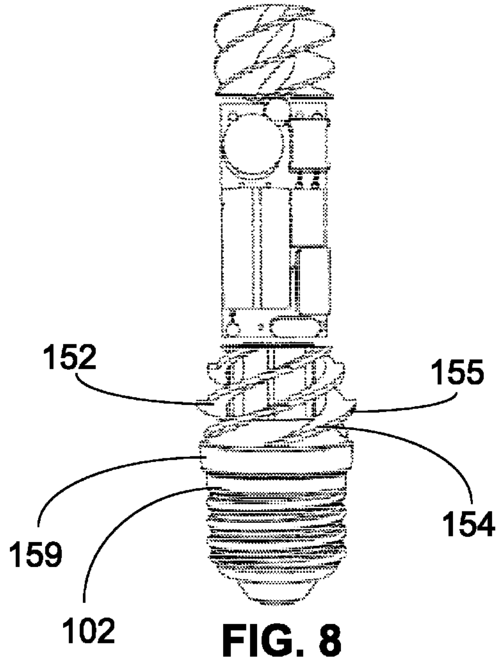
FIG. 8 is a side elevation view of the lighting device of FIG. 1 with the optic and the flexible circuit board removed.

Referring now to FIG. 7, additional elements of the present invention will now be discussed. In some embodiments, the lighting device 100 may include a structural member 170. The structural member 170 may be configured to facilitate the positioning of the flexible circuit board 120 in the optical chamber 160. More specifically, the structural member 170 may be configured to facilitate the positioning of the flexible circuit board 120 in the optical chamber 116 such that the flexible circuit board 120 may be retained at a certain position. Accordingly, the structural member 170 may be positioned within the optical chamber 116.

In some embodiments, the structural member 170 may be positioned external the optical chamber 116. The structural member 170 may comprise a plurality of arms 172. The plurality of arms 172 may extend generally proximally from a distal end of the optic 110. Additionally, at least one arm 172' of the plurality of arms 172 may have a first length, and a second arm 172" of the plurality of arms 172 may have a second length. The first and second lengths may be unequal. Each of the arms 172 may have a tangentially-extending section 174 and a radially-extending section 176. The radially-extending sections 176 of each arm 172 may be configured to interface with the flexible circuit board 120 providing support thereto. The tangentially-extending sections 174 of each arm 172 may be configured to provide structural member to the radially-extending sections 176 so as to prevent bending or flexure thereof. More specifically, each of the tangentially-extending arms 174 and the radially-extending arms 176 may be configured to resist flexure due to forces exerted thereupon, such as forces exerted as a result of the positioning and manipulation of the flexible circuit board 120.

Furthermore, in some embodiments, at least one of the arms 172 of the plurality of arms 172 may comprise a first section 175 positioned in the direction of the distal end of the optic 110, and a second section 177 positioned in the direction of the proximal end of the optic 110. Furthermore, the first section 175 may be generally hollow, and the second section 177 may be configured to be nested within the first section 175, such that the geometry of the second section 177 conforms to the geometry of the hollow of the first section 175. Furthermore, in some embodiments, the second section 177 may be configured to translate proximally and distally, positioning more or less of the second section 177 within the second section 177, resulting in a change in length of the containing arm 172. The second section 177 may include a feature that prevents the second section 177 from translating too far proximally, such that the second section 177 is prevented from becoming de-nested from the first section 175. More information regarding the translation of the second section 177 is provided hereinbelow.

Continuing to refer to FIG. 7, additional aspects of the structural member 170 will now be discussed in greater detail. The structural member 170 may be configured to be attached to the flexible circuit board 120. More specifically, the structural member 170 may be configured to be fixedly attached to a first end 121 of the flexible circuit board 120. In some other embodiments, the structural member 170 may be configured to be removably attached to the flexible circuit board 120. Any means or method of attachment known in the art may be employed in attaching the first end 121 to the structural member 170, including, but not limited to, adhesives, glues, welding, fasteners, frictional abutment, interference fits, and the like. For example, the structural member 170 may be configured to have a geometry such that when the flexible circuit board 120 is positioned so as to circumscribe the structural member 170, a force may be exerted upon the flexible circuit board 120 resulting in a frictional force preventing or inhibiting the motion of the flexible circuit board 120 relative to the structural member 140. The frictional force may be of a magnitude such that the flexible circuit board 120 may retain its position relative to the structural member 170 during normal operation, but may be selectively translated, moved, adjusted, rotated, or otherwise manipulated by a user, either through direct manipulation by the user or through manipulation of another element of the lighting device 100, as will be discussed in greater detail.

The structural member 170 may be configured to be attached to any structure of the lighting device 100 so as to be positioned within the optical chamber 116. In some embodiments, the structural member 170 may be attached to the optic 110. More specifically, in some embodiments, the structural member 170 may be attached to the distal section 118 of the optic 110. The structural member 170 may be attached by any method known in the art and included herein. Moreover, in some embodiments, the structural member 170 may be integrally formed with the optic 110, such as being integrally formed with the distal section 118.

Continuing to refer to FIG. 7, the longitudinal translation device 150 will now be discussed in greater detail. The longitudinal translation device 150 may be configured to longitudinally translate at least a part of the flexible circuit board 120. More specifically, the longitudinal translation device 150 may be configured to translate a second end 123 of the flexible circuit board 120 along a longitudinal axis of the optic 110.

The translation of the second end 123 of the flexible circuit board 120 may cause each of the proximal, medial, and distal folding sections 125, 126, 127 to be manipulated, resulting in the formation and/or adjustment of attending folds as described hereinabove. More specifically, as the second end 123 translates distally, the angles of inclination of at least one, and in some embodiments each of, the first and second inclined sections 128, 129 may increase by changes in the folds at each of the proximal, medial, and distal folding sections 125, 126, 127. Additionally, as the second end 123 translates proximally, the angles of inclination of at least one, and in some embodiments each of, the first and second inclined sections 128, 129 may decrease.

In some embodiments, due to the attachment of the first end 121 of the flexible circuit board 120 to the structural member 170, the first end 121 will not be translated as a result of manipulation by the longitudinal translation device 150. Moreover, as the flexible circuit board 120 is manipulated by the longitudinal translation device 150, the arms

172 of the structural member 170 may maintain the overall shape and geometry of the flexible circuit board 120, with the only change in shape being the extension of the first and second inclined sections 128, 129 generally radially outward from the longitudinal axis of the flexible circuit board 120. For example, where each of the first and second ends 121, 123 of the flexible circuit board 120 have a diameter, the diameter of each may be maintained while the longitudinal translation device 150 manipulates the flexible circuit board 120 by the support of the arms 172 preventing the deflection radially inwards of any part of the flexible circuit board 120. The above-mentioned diameter of the first and second ends 121, 123 may be configured to be determined by the positioning of the arms 127 within the optical chamber 116 in addition to the geometry of the radially-extending sections 176 of the arms 172, namely the distance the radially-extending arms 176 extend from the tangentially-extending arms 174. Furthermore, the various elements of the support structure 170 may be configured so as to define the diameters described hereinabove. For example, the support structure 170 may be configured to define a diameter that is sufficient to permit the positioning of the drive circuit 130 therewithin.

Figure 9:
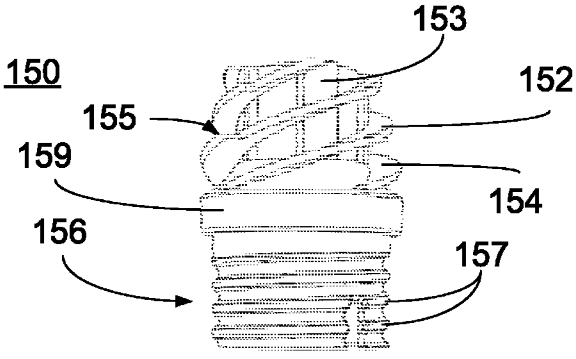
FIG. 9 is a side elevation view of a longitudinal translation device of the lighting device of FIG. 1.

Referring now additionally to FIG. 9, additional aspects of the longitudinal translation device 150 will now be discussed. The longitudinal translation device 150 may be any device that is capable of translating the flexible circuit board 120 as described hereinabove. In the present embodiment, the longitudinal translation device 150 includes a distal spiral member 152. The distal spiral member 152 may be positioned generally proximally of the arms 172 of the structural member 170. In some embodiments, the distal spiral member 152 may be configured to have a screw-type function. More specifically, the distal spiral member 152 may include a coupling section 159 that may be configured to rotatably couple to the base 102. The distal spiral member 152 may include a central member 153 and one or more ramps 154. The ramps 154 may be configured to extend distally from the coupling section 159 in a winding configuration generally about and conforming to an outer surface of the central member 153 having an angle of inclination as each ramp 154 extends distally, such that the ramps 154 may generally encircle the longitudinal axis of the optic 110. Furthermore, the ramps 154 may be attached to and carried by the central member 153.

In some embodiments, the distal spiral member 152 may further be configured to permit the flow of fluid therethrough. Furthermore, such fluid flow may permit the optical chamber 116 to be positioned in fluid communication with the environment surrounding the lighting device 100 thereby. More specifically, the distal spiral member 152 may permit fluid to flow therethrough, which may in turn flow through the proximal void 111 of the optic 110, thereby establishing fluid communication between the optical chamber 116 and the environment surrounding the lighting device 100. Moreover, in some embodiments, the fluid communication established by the distal spiral member 152 may cooperate with the fluid communication established by the venting member 180, permitting the continuous flow of fluid through the optical chamber 116 through both, further increasing the thermal dissipation capacity of the lighting device 100. Such fluid communication may increase the thermal dissipation capacity of the lighting device 100. Fluid flow may be permitted by the distal spiral member 152 through the voids formed between adjacent ramps 154. The positioning of the ramps 154 may prevent the entry of foreign material into the optical chamber 116 where the foreign material is not gaseous nor is suspended in the environment surrounding the lighting device 100. Moreover, the positioning of the distal spiral member 152 relative to the optic 110 may further inhibit entry of foreign material into the optical chamber 116.

The longitudinal translation device 150 may further comprise a proximal attachment member 156. The proximal attachment member 156 may be configured to attach the longitudinal translation device 150 to another element of the lighting device 100 so as to carry the longitudinal translation device 150. In the present embodiment, the proximal attachment member 156 comprises a plurality of threads 157. The plurality of threads 157 may be configured to cooperate with the plurality of threads 104 of the base 102, as is depicted in FIG. 1. More specifically, the plurality of threads 157 of the longitudinal translation device 150 may be configured to cooperate with the internal threads of the plurality of threads 104 of the base 102 such that the longitudinal translation device 150 may be carried by the base 102. Moreover, the position of the longitudinal translation device 150 along the longitudinal axis of the lighting device 100 may be adjusted by rotating the longitudinal translation device 150 causing the plurality of threads 157 to interface with the internal threads of the base 102, causing its translation thereby. This embodiment is exemplary only, and any other method of attaching the longitudinal translation device 150 to the lighting device 100 are contemplated and included within the scope of the invention. Moreover, any other means or method of causing the longitudinal translation of the longitudinal translation device 150 as is known in the art is contemplated and included within the scope of the invention.

Figure 10:
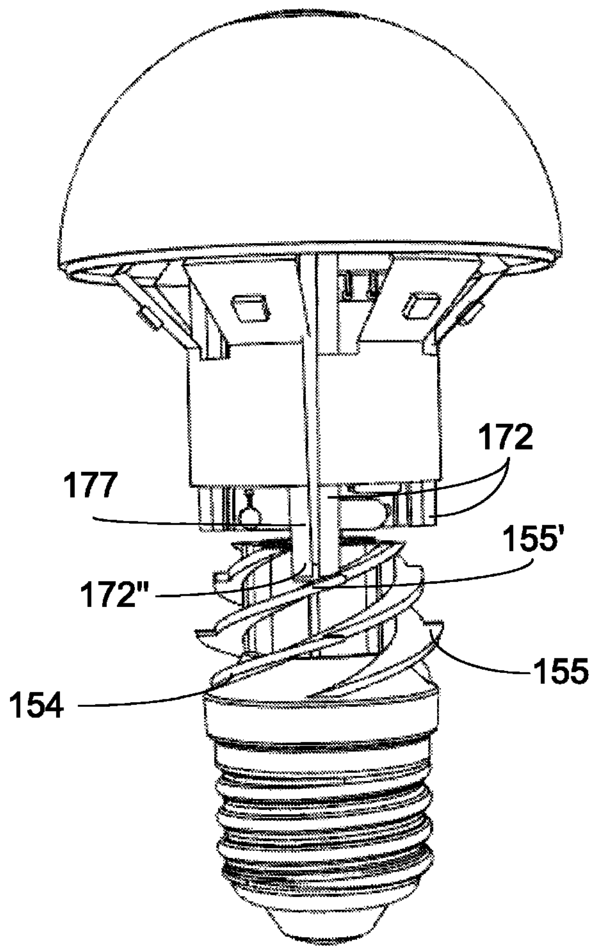
FIG. 10 is a side elevation view of the lighting device of FIG. 1 with the proximal section of the optic removed.

Referring now additionally to FIG. 10, additional aspects of the longitudinal translation device 150 will now be discussed. Each ramp 154 may include one or more interfacing sections 155. The interfacing sections 155 may extend generally radially outward from ramp 154. The interfacing sections 155 may be configured so as to interface with the support structure 170. More specifically, the interfacing sections 155 may be configured to interface with the arms 172 of the support structure 170. For example, as shown in the present embodiment, interfacing section 155' may be configured to interface with arm 172". More specifically, the interfacing section 155' may be configured to interface with a second section 177 of arm 172". Where the interfacing section 155' interfaces with the second section 177 of arm 172", the interfacing section 155' may exert a force upon the second section 177. Such an exertion of force may cause the second section 177 to longitudinally translate, further nesting the second section 177 within the first section 155 as described hereinabove.

The distance the second section 177 of arm 172" may be controlled by the translation of the longitudinal translation member 150 being translated through its interface with the base 102 via the proximal attachment member 156, as described hereinabove. More specifically, in the present embodiment, as the longitudinal translation device 150 is rotated, the interface between the proximal attachment member 156 and the base 102 may cause the longitudinal translation of the longitudinal translation device 150. As a result of this, the interface between the interfacing section 155' and the second section 177 of arm 172" may result in the longitudinal translation of the second section 177 of arm 172". Due to the attachment of the flexible circuit board 120 to the structural member 170, more specifically, to arm 172", the flexible circuit board 120 may be manipulated so as to translate longitudinally the second end 123 of the flexible circuit board 120, thereby causing the alteration of the angle of inclination of at least one of the first and second inclined sections 128, 129 of the plurality of longitudinal sections 122 as described hereinabove.

Additionally, the longitudinal translation device 150 may be configured to be manipulable by a user. In some embodiments, the longitudinal translation device 150 may include a user interfacing structure. The user interfacing structure may be a part of the longitudinal translation device 150 configured to facilitate the operation of the longitudinal translation device 150 by the user. In the present embodiment, the interfacing sections 155 may function as the user interfacing structure. In such embodiments, the interfacing sections 155 may be configured so as to facilitate the gripping thereof by a user, and may further facilitate the turning of the longitudinal translation device 150 by the user's gripping of the interfacing sections. Accordingly, in some embodiments, at least part of the interfacing section 155 may be textured, patterned, have grooves formed therein, or otherwise formed so as to facilitate the frictional engagement by the user, such as by a user's finger.

While the preceding discussion describes the function of the longitudinal translation device 150 to translate longitudinally at least a portion of the flexible circuit board 120, it is contemplated and included within the scope of the invention that the longitudinal translation device 150 may be non-operable to translate longitudinally any part of the flexible circuit board 120. In such embodiments, the longitudinal translation device 150 and all other elements of the lighting device 100 involved in the aforementioned longitudinal translation of the flexible circuit board 120 may still be operable to enable the initial positioning of the flexible circuit board 120 in a desirable position such that the angles of inclination of the first and second inclined sections 128, 129 of the plurality of longitudinal sections 122 are such that they result in the plurality of light sources 160 being oriented so as to adapt the lighting device 100 to emit light in a selected distribution. Moreover, the longitudinal translation device 150 may retain the characteristic of enabling the flow of fluid therethrough and into the optical chamber 116.

In some embodiments, the lighting device 100 may include a fluid flow generator (not shown). The fluid flow generator may be configured to generate a fluid flow. The fluid flow generator may be positioned in electrical communication with at least one of the base 102, the driver circuit 130, and the flexible circuit board 120. The fluid flow generator may be positioned such that, when it is operated to generate a fluid flow, the fluid flow increases the thermal dissipation capacity of the lighting device 100. In some embodiments, the fluid flow generator may be positioned so as to increase the flow of fluid through the optical chamber 116 through at least one of the proximal voids 111 and the distal voids 119, and in some embodiments, through both, such that the flow of fluid enters the optical chamber 116 through one and exits through the other. Additionally, in some embodiments, the fluid flow generator may be positioned so as to increase the flow of fluid within the optical chamber 116. Furthermore, in some embodiments, the optical chamber 116 may be sealed, so as to define a sealed chamber, and may have a fluid contained therein. In such embodiments, the fluid flow generator may be configured to increase the flow of fluid within the sealed optical chamber 116. More specifically, the fluid flow generator may be configured to generate a fluid flow that increases the thermal dissipation capacity of the lighting device 100. More information regarding the fluid flow generator may be found in U.S. patent application Ser. No. 13/107,782 entitled Sound Baffling Cooling System for LED Thermal Management and Associated Methods filed May 13, 2011, the content of which is incorporated herein by reference in its entirety.

Additionally, in some embodiments, the light device 100 may further include one or more heat sinks (not shown). The heat sinks may be configured to facilitate the conduction of thermal energy away from heat generating elements of the lighting device, including, but not limited to, the flexible circuit board 120, the driver circuit 130, and the plurality of light sources 160. Accordingly, the heat sinks may be formed of a thermally conductive material and may be positioned in thermal communication with said heat generating elements. Moreover, the heat sinks may be positioned so as to have a fluid flow incident thereupon. In some embodiments, the heat sinks may be positioned such that the fluid flow generated by a fluid flow generator is incident upon the heat sink. Moreover, the heat sink may be configured to include features so as to increase the thermal dissipation capacity thereof, including fins, such as microfins. More information regarding the configuration and placement of any heat sink may be found in U.S. patent application Ser. No. 13/107,782 which is incorporated by reference hereinabove.

Figure 11:
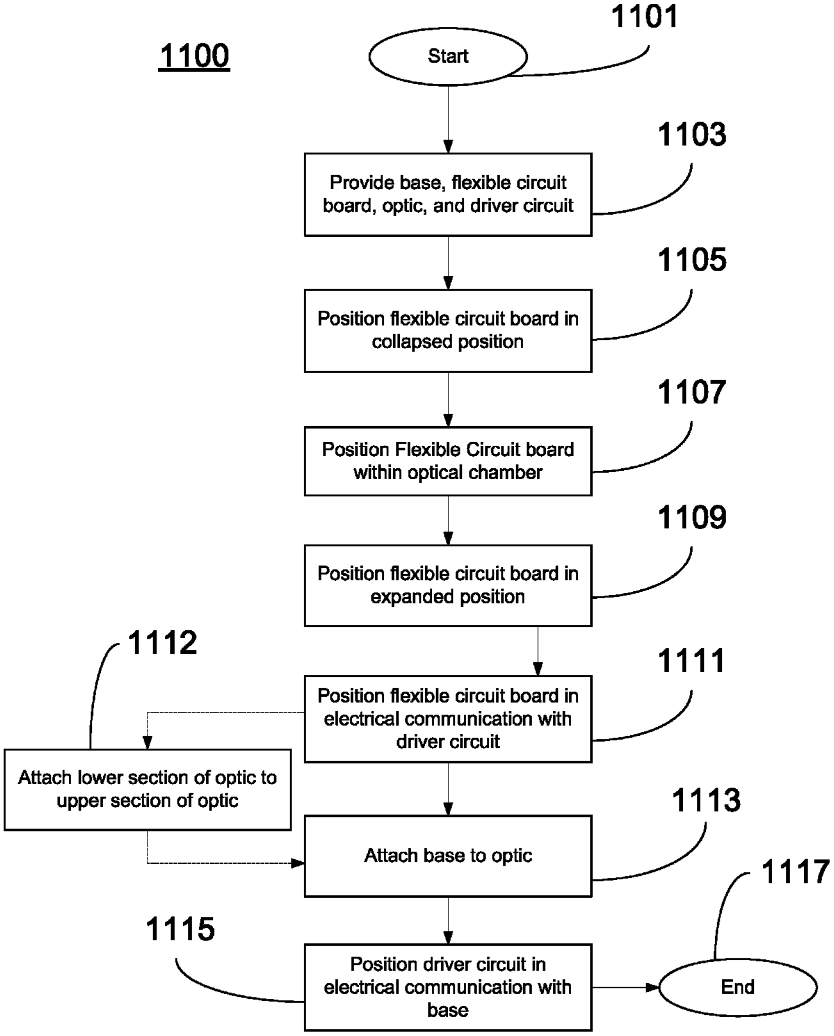
FIGS. 11-14 are flowcharts illustrating a method of assembling the lighting device illustrated in FIG. 1 according to an embodiment of the present invention.

Referring now to FIG. 11, a flowchart 1100 representing a method of assembling a lighting device according to an embodiment of the present invention is presented. The method may start at Block 1101. The method may then proceed to Block 1103 where a base, a flexible circuit board, an optic defining an optical chamber and having an aperture, and a driver circuit are provided. The method may then proceed to Block 1105 where the flexible circuit board is positioned in a collapsed position. It is appreciated that the flexible circuit board as depicted in FIG. 5 represents a flexible circuit board in an expanded position. In contrast, a flexible circuit board in a collapsed position may be generally cylindrical, such that the angle of inclination of the first and second inclined sections 128, 129 is approximately 0°.

The method may then proceed to Block 1107 where the flexible circuit board is passed through the aperture of the optic and positioned within the optical chamber. The method may then proceed to Block 1109 where the flexible circuit board is transitioned from the collapsed position to the expanded position, such that the angle of inclination of at least one of the first and second inclined sections 128, 129 is nonzero. Moreover, the positioning of the flexible circuit board may be performed so as to result in orienting a plurality of LEDs positioned upon the flexible circuit board so as to emit light in a direction that results in the lighting device emitting light in a selected distribution. The method may then proceed to Block 1111 where the flexible circuit board is positioned in electrical communication with the driver circuit. The method may then proceed to Block 1113 where the base is attached to the optic. It is appreciated that the base may be attached to the optic such that the base generally covers the aperture of the optic. The method may then proceed to Block 1115 where the driver circuit is positioned in electrical communication with the base. Finally, the method 1100 may end at Block 1117.

In some embodiments, the optic may comprise upper and proximal sections, as described hereinabove. In such embodiments, the aperture may be defined as an opening of the distal section where the proximal section is attachable to, but prior to said attachment. In such embodiments, the method may further include the step of attaching the proximal section to the distal section at Block 1112.

It is appreciated that the driver circuit is positioned within the optical chamber in the current method. In some embodiments, the driver circuit may be included on the flexible circuit board, as described hereinabove. Moreover, in some embodiments, the flexible circuit board may define a bounded region when positioned in the optical chamber. In such embodiments, the method may include the step of positioning the driver circuit within the bounded region.

Figure 12:
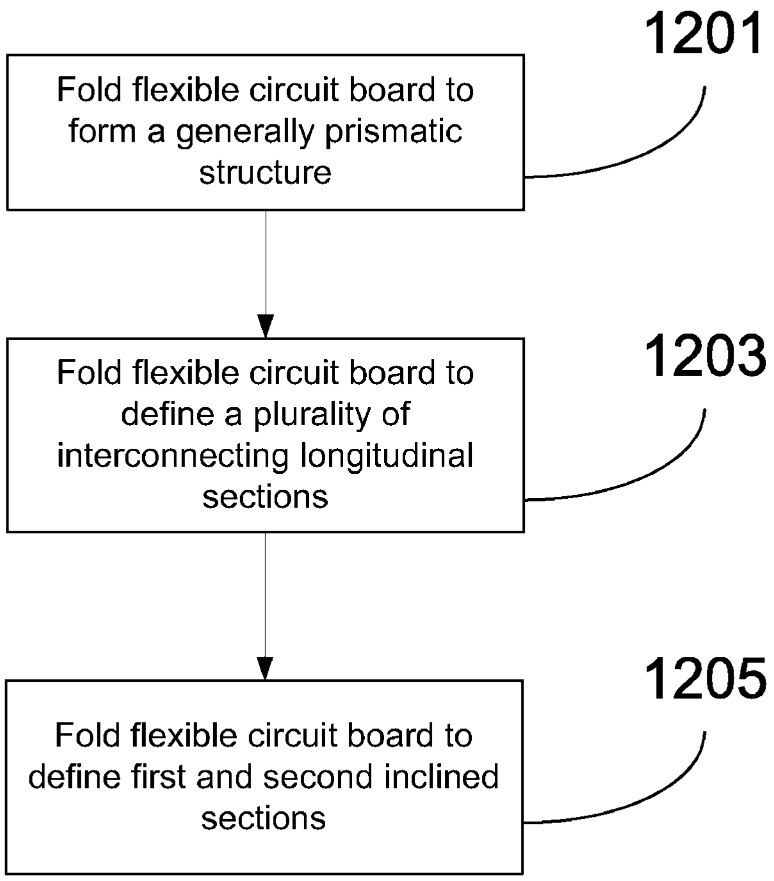

Referring now to FIG. 12, additional steps of method will now be discussed. In some embodiments, the flexible circuit board may be provided in a generally flat, sheet-like configuration. In such embodiments, the step of positioning the flexible circuit board in the collapsed position of Block 1105 may include a number of constituent steps, depicted in FIG. 12. For example, the step of positioning the flexible circuit board in the collapsed position may include the step of folding the flexible circuit board so as to form a generally prismatic structure at Block 1201. Furthermore, in some embodiments, the flexible circuit board may be folded so as to form a generally cylindrical structure. Next, in some embodiments, the flexible circuit board may be folded so as to define a plurality of longitudinal sections as described hereinabove, at Block 1203. Next, in some embodiments, the step of folding the flexible circuit board may include folding each of the longitudinal sections so as to define a first inclined section and a second inclined section, as described hereinabove, at Block 1205.

Figure 13:
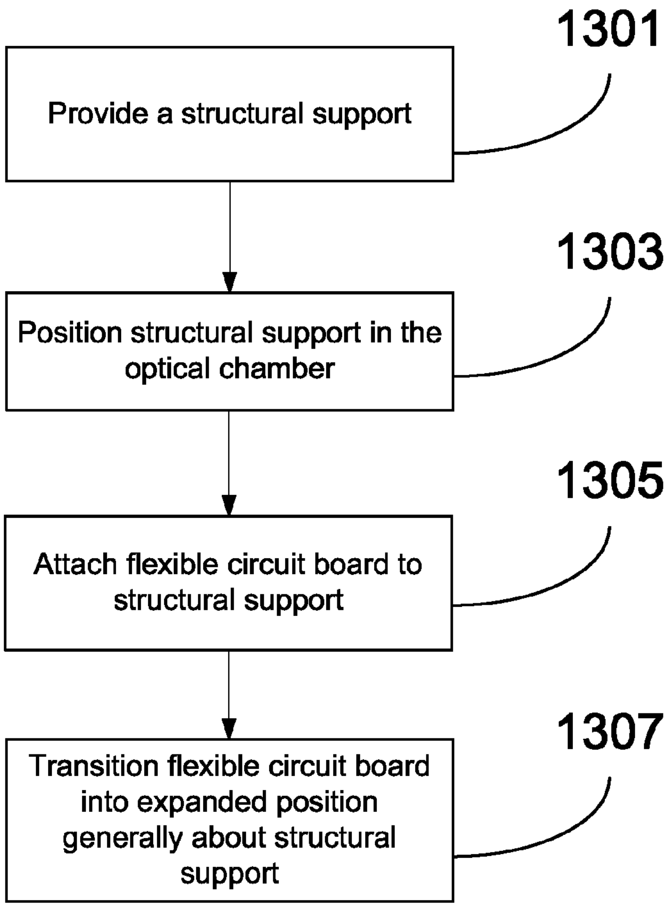

Referring now to FIG. 13, additional steps of method will now be discussed. In some embodiments, the lighting device may include a structural member, provided at Block 1301. The method may further include positioning the structural member in the optical chamber at Block 1303. In some embodiments, this step may be obviated, where the structural member is integrally formed with the optic. The method may further include attaching the flexible circuit board to the structural member at Block 1305. Additionally, the method may further include transitioning the flexible circuit board into the expanded position generally about the structural member at Block 1307. Such a transformation may be accomplished by any method described herein, including direct manipulation by the user.

Figure 14:
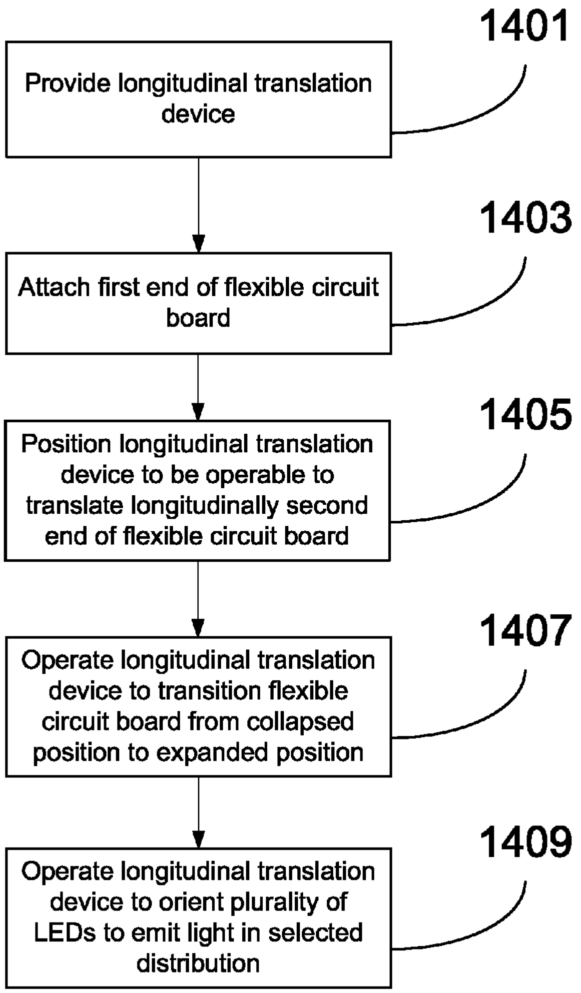

Referring now to FIG. 14, additional steps of method will now be discussed. In some embodiments, the step of positioning the flexible circuit board in an expanded position, as shown at Block 1109, may include a number of constituent steps. In some embodiments, the lighting device may further include a longitudinal translation device. In some embodiments, the longitudinal translation device has a generally spiraled configuration. The method may further including the step of providing a longitudinal translation device at Block 1401. The method may further include the step of fixedly attaching a first end of the flexible circuit board at Block 1403. The first end of the flexible circuit board may be attached to any element of the lighting device as may permit attachment thereto, including the optic and, where present, the structural member. The method may further include positioning the longitudinal translation device so as to be operable to translate longitudinally a second end of the flexible circuit board at Block 1405. Additionally, the method may further include operating the longitudinal translation device so as to transition the flexible circuit board from the collapsed position to the expanded position at Block 1407. In some embodiments, operating the longitudinal translation device may include turning or rotating the longitudinal translation device. Furthermore, the method may further include operating the longitudinal translation device so as to orient a plurality of LEDs associated with the flexible circuit board, such as those described hereinabove being positioned on first and second inclined sections of a plurality of longitudinal sections, to emit light in a direction that results in the lighting device being adapted to emit light in a selected distribution at Block 1409.

Some of the illustrative aspects of the present invention may be advantageous in solving the problems herein described and other problems not discussed which are discoverable by a skilled artisan.

While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

Thus the scope of the invention should be determined by the appended claims and their legal equivalents, and not by the examples given.

That which is claimed is:

1. A method of assembling a lighting device having a base, an optic having an inner surface defining an optical chamber, a structural member, a flexible circuit board having a plurality of LEDs positioned thereupon and being fixedly attached at a first end to the structural member, a longitudinal translation device configured to translate longitudinally a second end of the flexible circuit board, and a driver circuit, the method comprising the steps of:

positioning the structural member within the optical chamber; then attaching the flexible circuit board to the structural member; then positioning the flexible circuit board in a collapsed position; then disposing the flexible circuit board within the optical chamber by passing the flexible circuit board through an aperture of the optic; then transitioning the flexible circuit board into an expanded position by operating the longitudinal translation device; then attaching the base to the optic; and then positioning the driver circuit in electrical communication with the base.

2. The method of claim 1 further comprising orienting the plurality of LEDs to emit light in a direction that results in the lighting device being adapted to emit light in a selected distribution.

3. The method of claim 1 wherein the structural member is integrally formed with the optic.

4. The method of claim 1 wherein the longitudinal translation device has a generally spiraled configuration; wherein the longitudinal translation device interfaces with the structural member; and wherein the second end of the flexible circuit board is translated longitudinally by turning the longitudinal translation device.

5. The method of claim 1 wherein the flexible circuit board comprises a plurality of longitudinal sections, each longitudinal section comprising a first inclined section and a second inclined section; wherein each of the first and second inclined sections have associated therewith an LED of the plurality of LEDs; and wherein an orientation of the LED associated with each of the first and second inclined sections may be altered by operation of the longitudinal translation device; the method further comprising the step of operating the longitudinal translation device so as orient the LEDs associated with the first and second inclined sections to emit light in a direction that results in the lighting device being adapted to emit light in a selected distribution.

6. The method of claim 1 wherein the flexible circuit board is provided in a substantially flat configuration; and wherein the step of positioning the flexible circuit board in the collapsed position comprises folding the flexible circuit board so as to form a generally prismatic structure.

7. The method of claim 6 wherein the step of folding the flexible circuit board comprises folding the flexible circuit board so as to define a plurality of longitudinal sections.

8. The method of claim 7 wherein the step of folding the flexible circuit board comprises folding each of the longitudinal sections so as to define a first inclined section and a second inclined section.

9. The method of claim 1 wherein the flexible circuit board is formed into a generally cylindrical structure.

10. The method of claim 1 wherein the flexible circuit board defines a bounded region of the optical chamber; the method further comprising the step of positioning the driver circuit within the bounded region.

11. The method of claim 1 wherein the driver circuit is included on the flexible circuit board.

12. The method of claim 1 wherein the optic comprises an distal section and a proximal section; wherein the proximal section is configured to be attachable to the distal section; and wherein the aperture of the optic is defined by an opening of the distal section where the proximal section is not attached to the distal section; the method further comprising the step of attaching the proximal section to the distal section.

* * * * *